United States Patent
Thei et al.

(10) Patent No.: US 6,265,271 B1
(45) Date of Patent: Jul. 24, 2001

(54) INTEGRATION OF THE BORDERLESS CONTACT SALICIDE PROCESS

(75) Inventors: Kong-Beng Thei; Shou-Gwo Wuu, both of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/489,967

(22) Filed: Jan. 24, 2000

(51) Int. Cl.$^7$ .......................... H01L 21/336; H01L 21/44
(52) U.S. Cl. ........................................... 438/296; 438/682
(58) Field of Search ................... 438/294, 424, 438/296, 299, 682, 683

(56) References Cited

U.S. PATENT DOCUMENTS

| | | | |
|---|---|---|---|
| 5,512,778 | * 4/1996 | Chung et al. | |
| 5,516,726 | 5/1996 | Kim et al. | 437/189 |
| 5,545,581 | 8/1996 | Armacost et al. | 437/52 |
| 5,674,781 | 10/1997 | Huang et al. | 437/192 |
| 5,719,079 | 2/1998 | Yoo et al. | 438/238 |
| 5,780,348 | * 6/1998 | Lin et al. | |
| 5,937,325 | 8/1999 | Ishida | 438/655 |
| 6,005,279 | * 12/1999 | Luning | |
| 6,071,782 | * 6/2000 | Maa et al. | |

FOREIGN PATENT DOCUMENTS 11-345966 * 12/1999 (JP) .

* cited by examiner

*Primary Examiner*—Charles Bowers
*Assistant Examiner*—Evan Pert
(74) *Attorney, Agent, or Firm*—George O. Saile; Stephen B. Ackerman; Rosemary L. S. Pike

(57) ABSTRACT

A method for integrating salicide and borderless contact processes while avoiding current leakage at the shallow trench isolation edge is described. Shallow trench isolation (STI) regions are formed in a semiconductor substrate electrically isolating an active area from other active areas. A gate electrode and associated source and drain regions are formed in the active area wherein dielectric spacers are formed on sidewalls of the gate electrode. A metal layer is deposited over the gate electrode and associated source and drain regions. A first annealing of the semiconductor substrate transforms the metal layer into a metal silicide layer over the gate electrode and source and drain regions. The metal layer which is not transformed into a metal silicide overlying the dielectric spacers and shallow trench isolation regions is removed. An etch stop layer is deposited over the surface of the semiconductor substrate. A second annealing changes the metal silicide layer to a phase having lower resistance and also densifies the etch stop layer. An interlevel dielectric layer is deposited over the densified etch stop layer. A borderless contact opening is formed through the interlevel dielectric layer and the etch stop layer to one of the source and drain regions and the contact opening is filled with a conducting layer to complete fabrication of the integrated circuit device.

20 Claims, 5 Drawing Sheets

INTEGRATION OF THE BORDERLESS CONTACT SALICIDE PROCESS

BACKGROUND OF THE INVENTION (1) Field of the Invention

The present invention relates to the fabrication of integrated circuit devices, and more particularly, to a method of integrating salicide and borderless contact processes in the fabrication of integrated circuits.

(2) Description of the Prior Art

In the fabrication of integrated circuit devices, logic products are often produced using salicide (self-aligned silicide) processes in order to obtain higher circuit performance. In silicidation, a refractory metal layer is deposited and then annealed. The underlying silicon reacts with the refractory metal layer to produce a silicide overlying the gate electrode and source and drain regions. The silicided gate and source/drain regions have lower resistance than non-silicided regions, especially in smaller geometries, and hence, higher circuit performance.

In order to shrink cell size, a borderless contact is one of the most important processes in the art. Of major concern is the borderless contact leakage current for shallow junctions, especially at the edge of the shallow trench isolation (STI) regions. It is desired to find a method of integrating the salicide and the borderless contact processes while avoiding the leakage current problem at the STI edge.

U.S. Pat. No. 5,545,581 to Armacost et al teaches depositing a nitride layer over salicide to be used as an etch stop when making a contact. U.S. Pat. No. 5,937,325 to Ishida forms a salicide using two RTA steps, first forming the salicide over a gate, then forming a salicide over the source/drain. U.S. Pat. Nos. 5,719,079 to Yoo et al. and 5,674,781 to Huang et al. teach borderless contact processes but without etch stop layers. U.S. Pat. No. 5,516,726 to Kim et al. discloses an etch stop for a borderless contact process, but no salicide process.

SUMMARY OF THE INVENTION

Accordingly, it is a primary object of the present invention to provide an effective and very manufacturable method for integrating salicide and borderless contact processes in the fabrication of integrated circuits.

It is a further object of the invention to provide a process for integrating salicide and borderless contact processes while avoiding current leakage at the shallow trench isolation edge in the fabrication of logic circuits.

Yet another object is to provide a process for integrating salicide and borderless contact processes while avoiding current leakage at the shallow trench isolation edge by densifying a nitride liner film to protect the STI edge.

In accordance with the objects of the invention, a method for integrating salicide and borderless contact processes while avoiding current leakage at the shallow trench isolation edge by densifying a nitride liner film to protect the STI edge is achieved. Shallow trench isolation (STI) regions are formed in a semiconductor substrate surrounding and electrically isolating an active area from other active areas. A gate electrode and associated source and drain regions are formed in the active area wherein dielectric spacers are formed on sidewalls of the gate electrode. A metal layer is deposited over the gate electrode and associated source and drain regions. A first annealing of the semiconductor substrate transforms the metal layer into a metal silicide layer over the gate electrode and source and drain regions. The metal layer which is not transformed into a metal silicide overlying the dielectric spacers and shallow trench isolation regions is removed. An etch stop layer is deposited over the surface of the semiconductor substrate. A second annealing changes the metal silicide layer to a phase having lower resistance and also densifies the etch stop layer. An interlevel dielectric layer is deposited over the densified etch stop layer. A borderless contact opening is formed through the interlevel dielectric layer and the etch stop layer to one of the source and drain regions and the contact opening is filled with a conducting layer to complete fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

The present invention proposes a new borderless contact etch stop liner that is densified in order to improve the borderless contact etch window and to reduce borderless contact leakage current. A key advantage of the present invention is that the etch stop liner is densified without an additional thermal cycle. This process is suitable for multiple valued logic salicide processes, especially embedded SRAM and embedded DRAM. This process is also suitable to 0.18 $\mu$m and below cobalt salicide processes.

Figure 1:
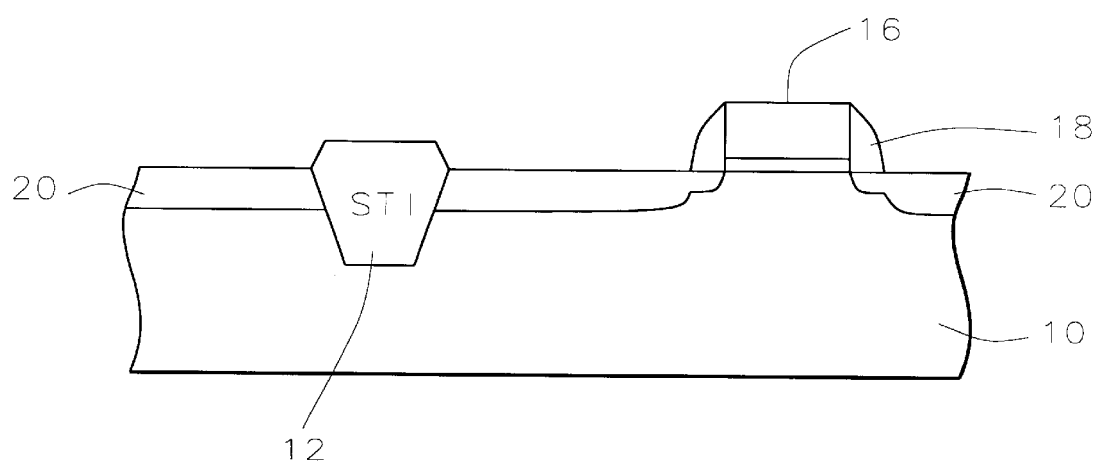
FIGS. 1 through 9 are cross-sectional representations of a preferred embodiment of the present invention.

Referring now more particularly to FIG. 1, there is shown a semiconductor substrate 10, preferably composed of monocrystalline silicon. Shallow trench isolation (STI) regions 12 may be formed as is conventional in the art.

Polysilicon gate electrodes, such as 16, are formed on the surface of the substrate, as is conventional. Lightly doped source and drain regions are formed as is conventional. NLDD and/or PLDD regions may be formed. Spacers 18 are formed on the sidewalls of the gate electrode 16. Ion implantations are performed to form heavily doped source and drain regions 20. If an embedded memory device is being fabricated, N+ or P+ regions for NMOS and PMOS are formed in the logic areas. Source/drain regions 20 in the memory areas should be N-type regions.

Figure 2:
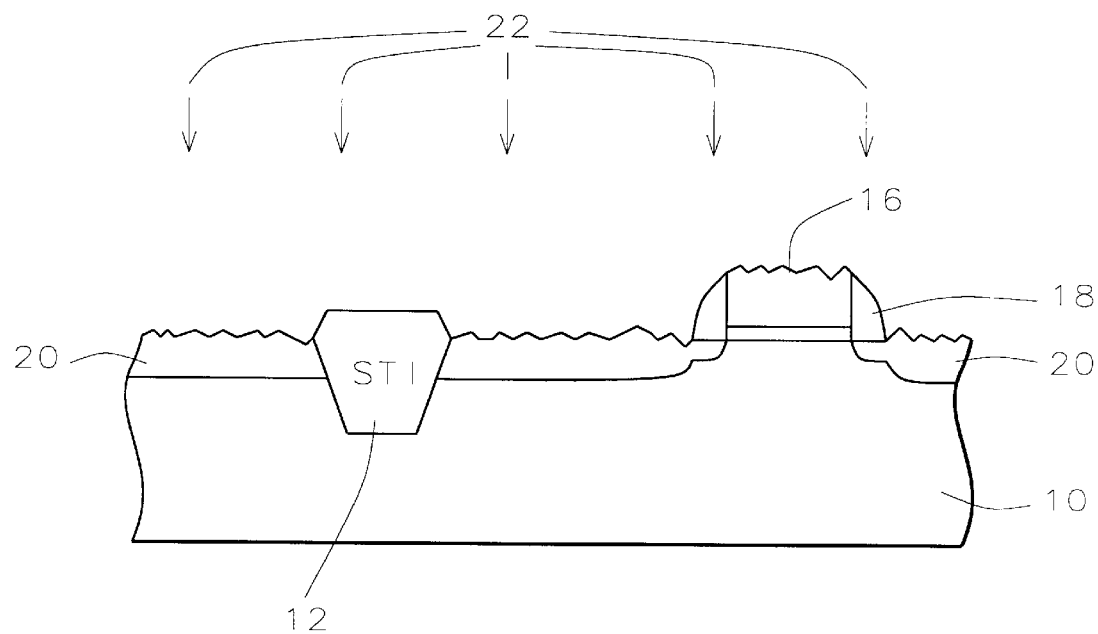

Referring now to FIG. 2, a pre-amorphization implant (PAI) 22 is performed to roughen the silicon surfaces, as shown. The PAI is an arsenic implant at a dosage of between about 1E13 and 1E15 atom/cm$^2$ at an energy of 10 to 40 KeV. Now, a pre-metallization dip, typically in hydrofluoric acid (HF), is performed to remove native oxide on the silicon surfaces.

Figure 3:
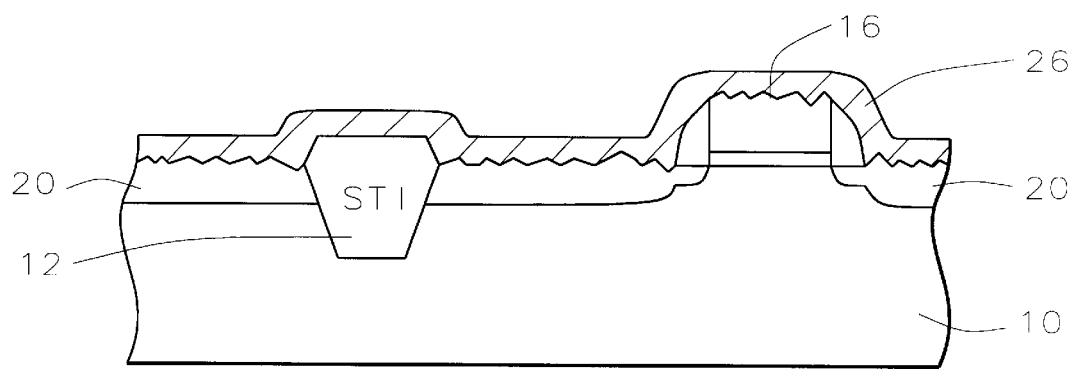
Figure 4:
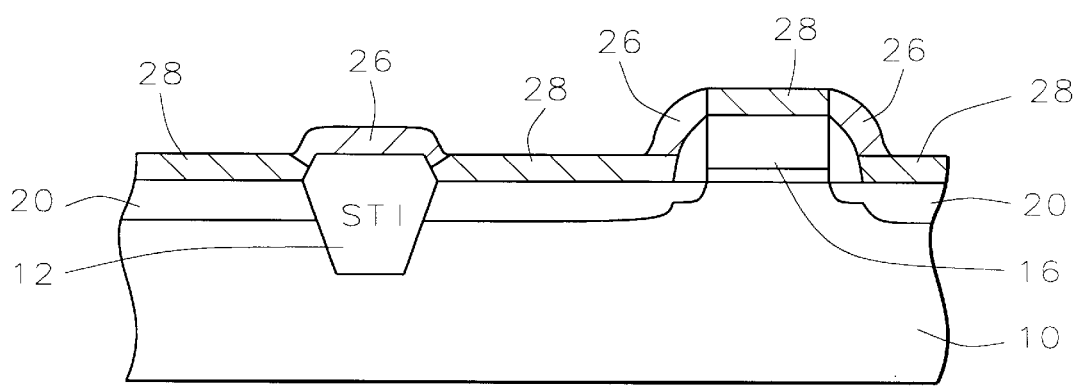

A layer of metal 26 is sputter deposited over the surface of the substrate, as shown in FIG. 3. This metal 26 may be titanium, cobalt, nickel, tantalum, or the like, deposited to a thickness of between about 40 and 400 Angstroms.

Optionally, a silicon ion mixing implant may be performed now into the metal layer in order to make the resulting silicide silicon-rich. For example, silicon ions may be implanted into the metal layer at an energy of 20 to 60 KeV and dosage of 1E13 to 1E15 atoms/cm$^2$.

Now, a first rapid thermal annealing (RTA) step is performed at a temperature of between about 680 and 730° C. for between about 10 and 30 seconds for titanium and at 500 to 600° C. for between about 10 and 30 seconds for cobalt. The metal layer overlying the source/drain regions 20 of the silicon substrate and overlying the polysilicon gate electrode 16 is transformed by the RTA to a silicide layer 28, for example titanium silicide (TiSi) or cobalt silicide (CoSi). The metal 26 overlying the dielectric spacers 18 and the STI region 12 is unreacted.

Figure 5:
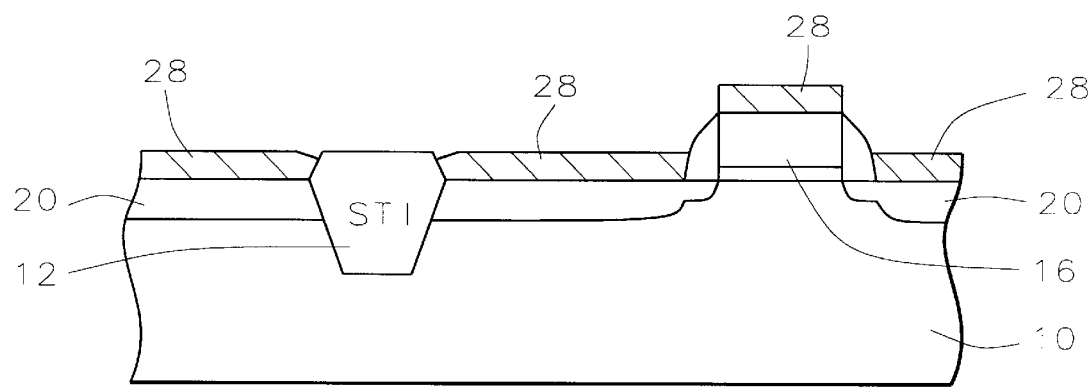

The unreacted metal 26 is removed, for example using a solution of $NH_4OH:H_2O_2:H_2O$, as shown in FIG. 5. The silicide layer 28 has high resistance. It must be annealed again to lower its resistance. However, in the process of the present invention, this second annealing is not yet performed.

Figure 6:
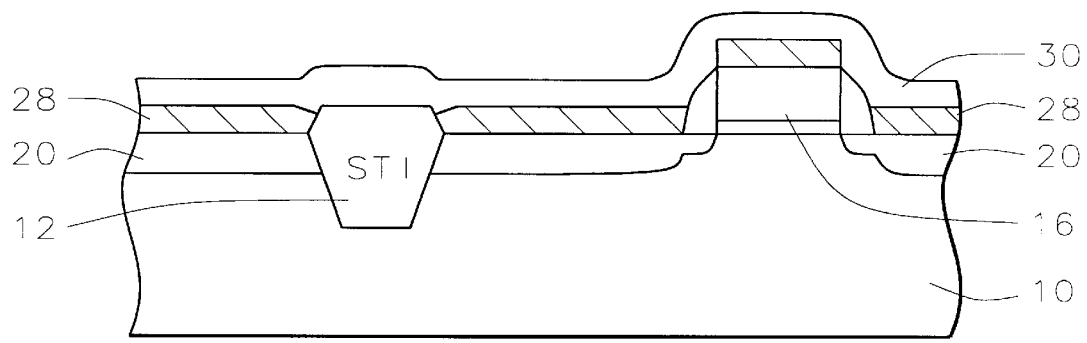

In a key step of the present invention, a borderless contact etch stop layer 30 is now deposited over the surface of the substrate, as shown in FIG. 6. This etch stop layer 30 comprises silicon oxynitride deposited by chemical vapor deposition (CVD) or silicon nitride deposited by plasma enhanced chemical vapor deposition (PECVD) at less than about 450° C. The etch stop layer 30 has a thickness of between about 200 and 600 Angstroms. The etch stop layer 30 should not be formed by a furnace silicon nitride deposition. This type of layer is very dense, but the high temperature of the furnace, between about 650 and 780° C. for about two hours, may effect the thermal stability and agglomeration of the salicide 28.

Now, a second rapid thermal annealing (RTA) step is performed at a temperature of between about 850 and 900° C. for about 30 seconds. This second RTA lowers the resistance of the salicide layer. For example, if the salicide is TiSi, the RTA is performed at 880° C. for 30 seconds. The TiSi at phase C49 is changed to titanium disilicide ($TiSi_2$) at phase C54. If the salicide is CoSi, the RTA is performed at 850° C. for 30 seconds to bring about the cobalt phase change to $CoSi_2$. The second key effect of the second RTA is to densify the etch stop layer 30 which will increase the borderless etch selectivity.

Figure 7:
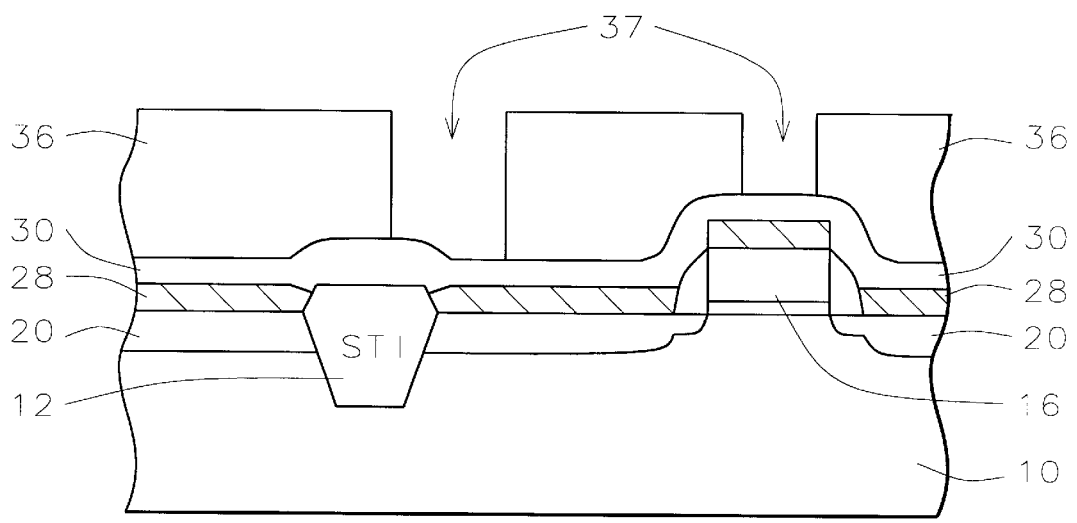

Referring now to FIG. 7, an interlevel dielectric (ILD) layer 36 is deposited over the substrate. Then a borderless contact is formed. The ILD layer 36 is etched away where it is not covered by a mask, not shown, to form a contact opening 37.

Figure 8:
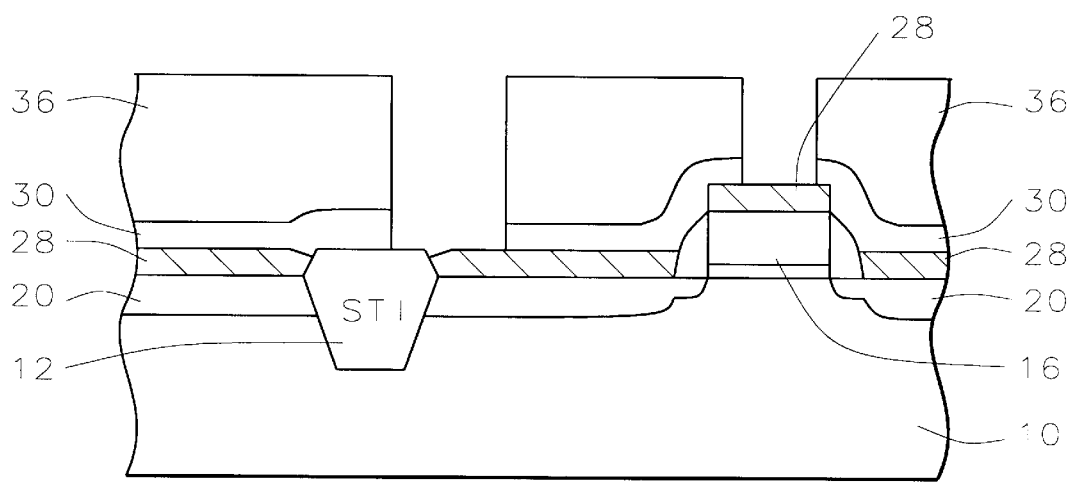
Figure 9:
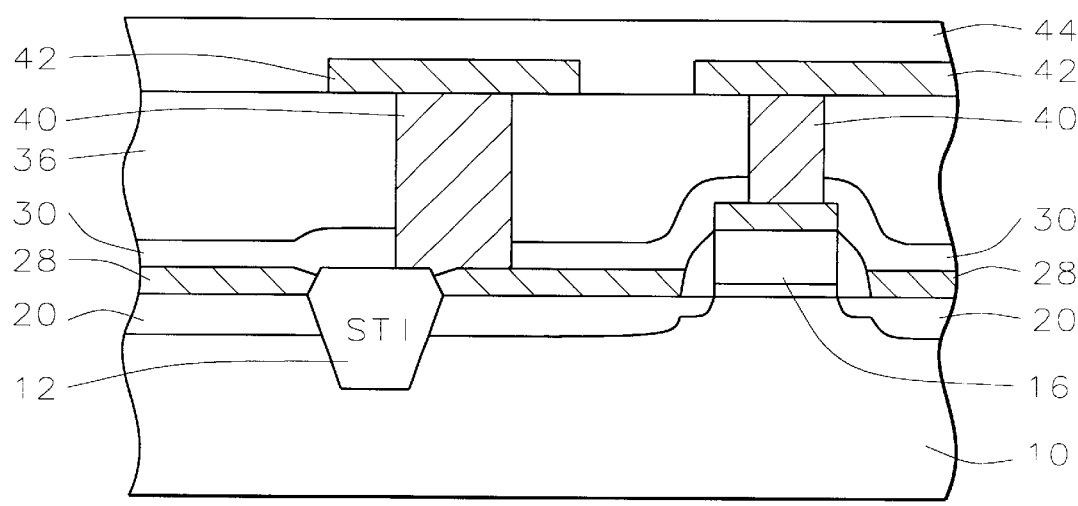

Now the densified etch stop layer 30 is etched away within the contact opening, as shown in FIG. 8. Because the etch stop layer 30 has been densified, it has a high etch selectivity. In this invention, there is no extra thermal cycle required for this densification so the devices already formed will not be affected. Thus, the etch stop layer 30 can be etched away without undesirable overetching of an underlying edge of the STI region 12. This in turn prevents current leakage at the STI edge.

The process of the present invention overcomes big yield problems, especially in embedded SRAM devices where random single bit failures had been seen before implementation of the process of the invention.

Processing now continues as is conventional in the art to complete the contacts. For example, tungsten plugs 40 may be formed within the contact openings. Metal lines 42, such as aluminum or an aluminum alloy may be formed over the tungsten plugs and covered with a passivation layer 44. The process of the present invention reduces borderless contact leakage current to the substrate at the STI edge and improves the borderless contact etching window by forming a densified CVD etch stop liner film. The process of the invention densifies the liner film without an additional RTA thermal cycle.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

forming shallow trench isolation regions in a semiconductor substrate surrounding and electrically isolating an active area from other active areas;

forming a gate electrode and associated source and drain regions in said active area wherein dielectric spacers are formed on sidewalls of said gate electrode;

depositing a metal layer over said gate electrode and associated source and drain regions;

first annealing said semiconductor substrate whereby said metal layer is transformed into a metal silicide layer over said gate electrode and over said source and drain regions;

removing said metal layer which is not transformed into said metal silicide overlying said dielectric spacers and said shallow trench isolation regions;

thereafter depositing an etch stop layer over the surface of said semiconductor substrate;

thereafter second annealing said semiconductor substrate whereby said metal silicide layer is changed to a phase having lower resistance and whereby said etch stop layer is densified;

depositing an interlevel dielectric layer over said densified etch stop layer;

forming a borderless contact opening through said interlevel dielectric layer and said etch stop layer to one of said source and drain regions; and filling said contact opening with a conducting layer to complete fabrication of said integrated circuit device.

2. The method according to claim 1 wherein said metal layer comprises one of the group containing titanium, cobalt, tantalum, and nickel.

3. The method according to claim 1 wherein said first annealing is a rapid thermal anneal (RTA) performed at a temperature of between about 500 and 730° C. for about 30 seconds.

4. The method according to claim 1 wherein said etch stop layer comprises silicon oxynitride deposited by chemical vapor deposition to a thickness of between about 200 and 600 Angstroms.

5. The method according to claim 1 wherein said etch stop layer comprises silicon nitride deposited by plasma enhanced chemical vapor deposition to a thickness of between about 200 and 600 Angstroms.

6. The method according to claim 1 wherein said second annealing is a rapid thermal anneal (RTA) performed at a temperature of between about 850 and 900° C. for between about 10 to 30 seconds.

7. The method according to claim 1 wherein said step of forming said borderless contact opening comprises:

etching through said interlevel dielectric layer to said densified etch stop layer; and etching away said densified etch stop layer within said borderless contact opening wherein said densified etch stop layer has an etch selectivity such that underlying said shallow trench isolation is not etched into whereby leakage current from said conducting layer to said substrate is reduced.

8. A method of fabricating an integrated circuit device comprising:

forming shallow trench isolation regions in a semiconductor substrate surrounding and electrically isolating an active area from other active areas;

forming a gate electrode and associated source and drain regions in said active area wherein dielectric spacers are formed on sidewalls of said gate electrode;

depositing a metal layer over said gate electrode and associated source and drain regions;

first annealing said semiconductor substrate whereby said metal layer is transformed into a metal silicide layer over said gate electrode and over said source and drain regions;

removing said metal layer which is not transformed into said metal silicide overlying said dielectric spacers and said shallow trench isolation regions;

thereafter depositing an etch stop layer over the surface of said semiconductor substrate;

thereafter second annealing said semiconductor substrate whereby said metal silicide layer is changed to a phase having lower resistance and whereby said etch stop layer is densified;

depositing an interlevel dielectric layer over said densified etch stop layer;

forming a borderless contact opening through said interlevel dielectric layer and said etch stop layer to one of said source and drain regions by the steps of:
 etching through said interlevel dielectric layer to said densified etch stop layer; and
 etching away said densified etch stop layer within said borderless contact opening wherein said densified etch stop layer has an etch selectivity such that underlying said shallow trench isolation is not etched into whereby leakage current from said conducting layer to said substrate is reduced; and
 filling said contact opening with a conducting layer to complete fabrication of said integrated circuit device.

9. The method according to claim 8 wherein said metal layer comprises one of the group containing titanium, cobalt, tantalum, and nickel.

10. The method according to claim 8 wherein said first annealing is a rapid thermal anneal (RTA) performed at a temperature of between about 500 and 730° C. for about 30 seconds.

11. The method according to claim 8 wherein said etch stop layer comprises silicon oxynitride deposited by chemical vapor deposition to a thickness of between about 200 and 600 Angstroms.

12. The method according to claim 8 wherein said etch stop layer comprises silicon nitride deposited by plasma enhanced chemical vapor deposition to a thickness of between about 200 and 600 Angstroms.

13. The method according to claim 8 wherein said second annealing is a rapid thermal anneal (RTA) performed at a temperature of between about 850 and 900° C. for between about 10 to 30 seconds.

14. A method of fabricating an integrated circuit device comprising:

forming shallow trench isolation regions in a semiconductor substrate surrounding and electrically isolating an active area from other active areas;

forming a gate electrode and associated source and drain regions in said active area wherein dielectric spacers are formed on sidewalls of said gate electrode;

depositing a metal layer over said gate electrode and associated source and drain regions;

first annealing said semiconductor substrate whereby said metal layer is transformed into a metal silicide layer over said gate electrode and over said source and drain regions;

removing said metal layer which is not transformed into said metal silicide overlying said dielectric spacers and said shallow trench isolation regions;

thereafter depositing an etch stop layer over the surface of said semiconductor substrate;

thereafter second annealing said semiconductor substrate whereby said metal silicide layer is changed to a phase having lower resistance and whereby said etch stop layer is densified;

depositing an interlevel dielectric layer over said densified etch stop layer;

forming a borderless contact opening through said interlevel dielectric layer and said etch stop layer to one of said source and drain regions by the steps of:
 etching through said interlevel dielectric layer to said densified etch stop layer; and
 etching away said densified etch stop layer within said borderless contact opening wherein said densified etch stop layer has an etch selectivity such that underlying said shallow trench isolation is not etched into whereby leakage current from said conducting layer to said substrate is reduced;

forming a tungsten plug within said contact opening;

forming a conducting line overlying said tungsten plug; and depositing a passivation layer overlying said conducting line to complete fabrication of said integrated circuit device.

15. The method according to claim 14 wherein said metal layer comprises one of the group containing titanium, cobalt, tantalum, and nickel.

16. The method according to claim 14 wherein said first annealing is a rapid thermal anneal (RTA) performed at a temperature of between about 500 and 730° C. for between about 10 to 30 seconds.

17. The method according to claim 14 wherein said etch stop layer comprises silicon oxynitride deposited by chemical vapor deposition to a thickness of between about 200 and 600 Angstroms.

18. The method according to claim 14 wherein said etch stop layer comprises silicon nitride deposited by plasma enhanced chemical vapor deposition to a thickness of between about 200 and 600 Angstroms.

19. The method according to claim 14 wherein said second annealing is a rapid thermal anneal (RTA) performed at a temperature of between about 850 and 900° C. for between about 10 to 30 seconds.

20. The method according to claim 14 wherein said integrated circuit device is an embedded memory device.

* * * * *